US012588164B2

(12) United States Patent
George et al.

(10) Patent No.: US 12,588,164 B2
(45) **Date of Patent: *Mar. 24, 2026**

(54) SYSTEMS AND METHODS FOR ELECTRONICS COOLING

(71) Applicant: Eagle Technology, LLC, Melbourne, FL (US)

(72) Inventors: Donald S. George, West Melbourne, FL (US); William Joel D. Johnson, Palm Bay, FL (US)

(73) Assignee: Eagle Technology, LLC, Melbourne, FL (US)

( * ) Notice: Subject to any disclaimer, the term of this patent is extended or adjusted under 35 U.S.C. 154(b) by 280 days.

This patent is subject to a terminal disclaimer.

(21) Appl. No.: 18/535,612

(22) Filed: Dec. 11, 2023

(65) Prior Publication Data

US 2024/0107710 A1     Mar. 28, 2024

Related U.S. Application Data

(63) Continuation of application No. 17/671,200, filed on Feb. 14, 2022, now Pat. No. 11,895,805.

(51) Int. Cl.
*H05K 7/20* (2006.01)
*H05K 7/14* (2006.01)

(52) U.S. Cl.
CPC ....... *H05K 7/20309* (2013.01); *H05K 7/1424* (2013.01); *H05K 7/20272* (2013.01);
(Continued)

(58) Field of Classification Search
CPC ............. H05K 7/1424; H05K 7/20309; H05K 7/1418; H05K 7/1417; H05K 7/20636; H05K 7/20536
See application file for complete search history.

(56) References Cited

U.S. PATENT DOCUMENTS 4,543,793 A     10/1985  Chellis et al.
5,701,751 A     12/1997  Flores
(Continued)

FOREIGN PATENT DOCUMENTS

CN     102026527     4/2011
DE     4330923     3/1995
(Continued)

OTHER PUBLICATIONS

EP-3422834-A1 Translation (Year: 2019).*
(Continued)

*Primary Examiner* — Jayprakash N Gandhi
*Assistant Examiner* — Matthew Sinclair Muir
(74) *Attorney, Agent, or Firm* — Fox Rothschild LLP; Carol E. Thorstad-Forsyth

(57) ABSTRACT

Systems and methods for providing an electronic cooling apparatus comprising a chassis having an internal space that is sized/shaped to receive/structurally support circuit card(s). The internal space defined by sidewalls with a channel formed therein in which a coolant is disposed. The coolant is in thermal communication with the circuit card(s) via the sidewall(s) when the circuit card(s) is(are) disposed in the chassis. A refrigerant-based cooling system is disposed in the chassis and comprises an evaporator having inlet/outlet ports coupled to the channel of the chassis to define a first closed-loop channel for the coolant within the chassis. The evaporator facilitates heat transfer from the coolant to a refrigerant flowing through a second closed-loop channel of the chassis at least partially defined by the evaporator. A pump is disposed in the chassis and configured to cause the coolant to flow through the first closed-loop channel.

20 Claims, 15 Drawing Sheets

(52) U.S. Cl.
CPC ..... *H05K 7/20327* (2013.01); *H05K 7/20354* (2013.01); *H05K 7/2039* (2013.01); *H05K 7/20636* (2013.01); *H05K 7/20672* (2013.01)

(56) References Cited

U.S. PATENT DOCUMENTS

| | | | |
|---|---|---|---|
| 5,778,688 | A | 7/1998 | Park et al. |
| 5,953,224 | A | 9/1999 | Gold et al. |
| 6,213,194 | B1 | 4/2001 | Chrysler et al. |
| 6,397,618 | B1 | 6/2002 | Chu et al. |
| 6,611,428 | B1 | 8/2003 | Wong |
| 6,687,122 | B2 | 2/2004 | Monfarad |
| 6,782,706 | B2 | 8/2004 | Holmes et al. |
| 7,068,509 | B2 | 6/2006 | Bash et al. |
| 7,203,063 | B2 | 4/2007 | Bash et al. |
| 7,398,849 | B2 | 7/2008 | Yoshida |
| 7,460,367 | B2 | 12/2008 | Tracewell et al. |
| 7,484,552 | B2 | 2/2009 | Pfahnl |
| 7,486,513 | B2 | 2/2009 | Hall et al. |
| 7,701,714 | B2 | 4/2010 | Shabany |
| 7,848,101 | B2 | 12/2010 | Dey et al. |
| 8,000,103 | B2 | 8/2011 | Lipp et al. |
| 8,422,218 | B2 | 4/2013 | Fried et al. |
| 9,109,622 | B2 | 8/2015 | Meacham et al. |
| 9,392,725 | B2 * | 7/2016 | Stringer ............. H05K 7/20009 |
| 9,832,912 | B2 | 11/2017 | Klein |
| 2004/0057211 | A1 * | 3/2004 | Kondo ...................... G06F 1/20 361/696 |

| | | | |
|---|---|---|---|
| 2004/0163403 | A1 | 8/2004 | Monfarad |
| 2007/0119199 | A1 * | 5/2007 | Weber ................... H01L 23/427 257/E23.088 |
| 2008/0013283 | A1 | 1/2008 | Gilbert et al. |
| 2008/0156003 | A1 | 7/2008 | Mongia |
| 2008/0259566 | A1 | 10/2008 | Fried |
| 2011/0317367 | A1 | 12/2011 | Campbell et al. |
| 2016/0120019 | A1 | 4/2016 | Shedd et al. |
| 2017/0234623 | A1 | 8/2017 | Fried |

FOREIGN PATENT DOCUMENTS

| | | | |
|---|---|---|---|
| DE | 4330925 | 3/1995 | |
| DE | 102007020037 | 10/2008 | |
| EP | 3422834 A1 * | 1/2019 | ......... H05K 7/20772 |
| JP | H0697338 | 4/1994 | |
| NL | 4120021 | 10/1978 | |

OTHER PUBLICATIONS

Elma Electronics UK, "Rugged COTS Encliosures and Embedded Computing Products," https://www.army-technology.com/contractors/computers/elmaelectronic/> accessed on Jan. 27, 2022 (1 page).
Keller, "Small Chassis and enclosures take on the heat," https://www.militaryaerospace.com/articles/print/volume-28/issue-2/technology-focus/small-chassis-and-enclosures-take-on-the-heat.html accessed Jan. 27, 2022 (18 pages).

* cited by examiner

Parting Sheet

Side

Fin

Side

Fluid

Parting Sheet b tr c x

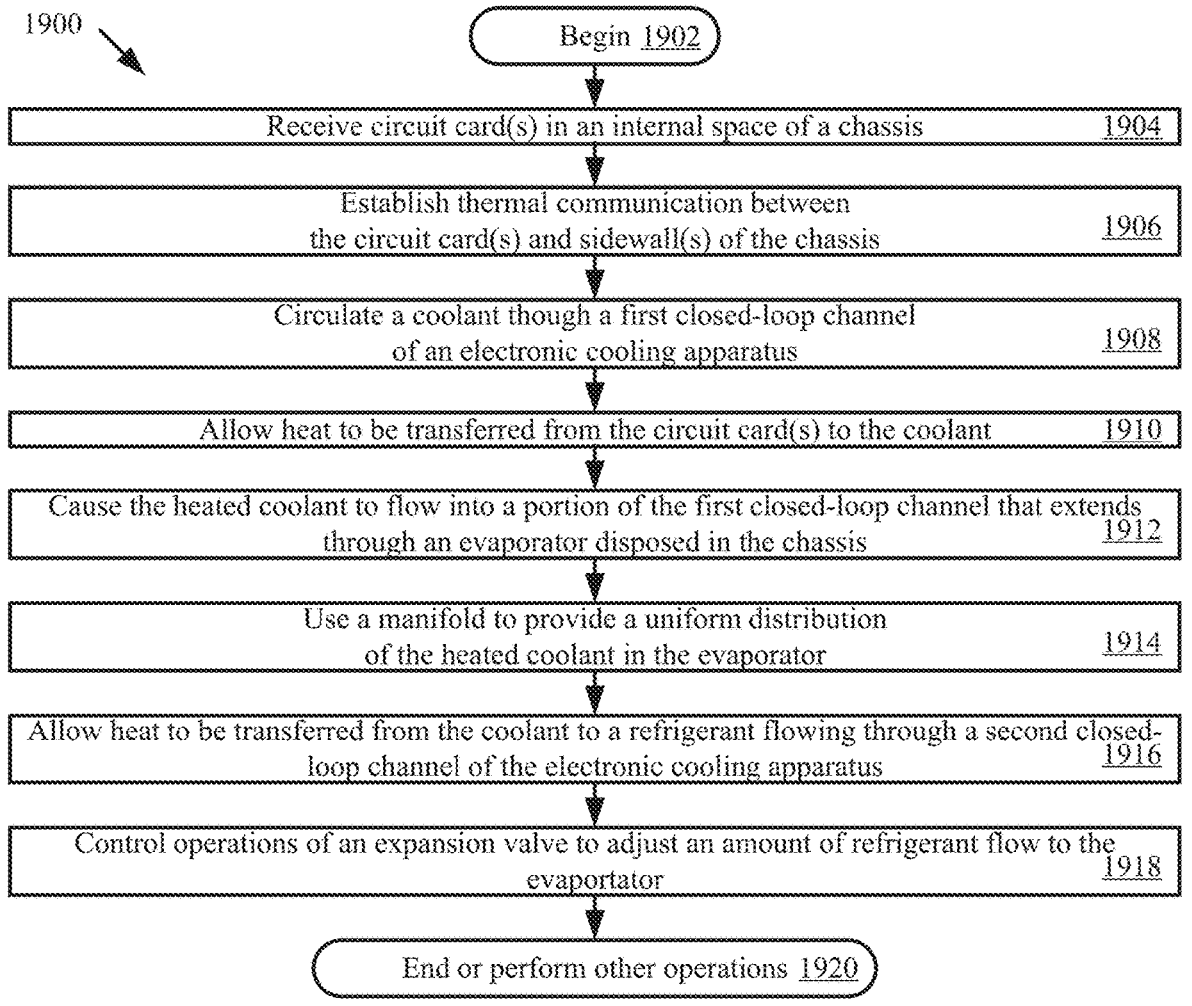

1900

Begin 1902

Receive circuit card(s) in an internal space of a chassis    1904

Establish thermal communication between
the circuit card(s) and sidewall(s) of the chassis    1906

Circulate a coolant though a first closed-loop channel
of an electronic cooling apparatus    1908

Allow heat to be transferred from the circuit card(s) to the coolant    1910

Cause the heated coolant to flow into a portion of the first closed-loop channel that extends
through an evaporator disposed in the chassis    1912

Use a manifold to provide a uniform distribution
of the heated coolant in the evaporator    1914

Allow heat to be transferred from the coolant to a refrigerant flowing through a second closed-
loop channel of the electronic cooling apparatus    1916

Control operations of an expansion valve to adjust an amount of refrigerant flow to the
evaportator    1918

End or perform other operations 1920

FIG. 19

SYSTEMS AND METHODS FOR ELECTRONICS COOLING

CROSS REFERENCE TO RELATED APPLICATIONS

This application is a Continuation of U.S. patent application Ser. No. 17/671,200, filed on Feb. 14, 2022. The entire contents of this patent application are herein incorporated by reference.

STATEMENT OF THE TECHNICAL FIELD

The present document concerns electronic systems. More specifically, the present document concerns implementing systems and methods for electronics cooling in the electronic systems.

BACKGROUND

Description of the Related Art

Many communications systems, especially those intended for use in mobile platforms, must be environmentally robust both in terms of their hardware and signaling format. Airborne communication systems used with a plurality of UHF line-of-sight and satellite links, for example, may incorporate a transceiver mounting chassis or enclosure containing diverse communication equipment such as RF transmitter modules, RF receiver modules and various digital signal processing modules which control operation of the RF components and interface digital communications signals with attendant encryption and decryption circuits. Considering that each communication link has its own dedicated signaling scheme, suppliers of this equipment typically provide each system as an integrated unit.

One of the standard architectures employed by suppliers of such systems is the Versa Module Europa or VME bus. RF signaling circuits and digital signaling modules plug into discrete connector slots on the VME bus to avoid crosstalk and provide isolation between such components, and, to conform with the relatively tight dimensional spacing between the connector slots on the VME bus. Whether the communication system is intended for use in a mobile platform as noted above, or other applications, the enclosure or chassis which houses the VME bus and communication equipment components must be designed to withstand harsh environmental conditions including vibration, temperature variations and exposure to foreign matter. Consequently, VME bus specifications mandate ruggedized housing architectures which have the ability to cool circuit components and protect them from exposure to excess vibration and foreign material.

Initial efforts to meet VME bus specifications included chassis designs incorporating expensive and complex heat transfer elements. Alternatively, or in addition to these measures, the circuit card assemblies were provided with special, thermally robust circuit elements which added cost and unwanted bulk to the design.

These deficiencies were addressed to some extent in the system disclosed in U.S. Pat. No. 5,835,349 to Giannatto et al. ("The '349 Patent"). This patent discloses a housing and cooling assembly which reduces the cost and overall size of the unit, while providing effective cooling of circuit components on the circuit card assemblies. A "U-pass" heat exchanger is mounted directly to each individual circuit card assembly which imparts structural rigidity to the cards and isolates the circuit cards from the flow of cooling fluid, e.g. air, passing through the heat exchanger in a U-shaped flow path to and from an inlet/exhaust plenum. The circuit card assembly of each circuit card/heat exchanger combination or module is plugged into the VME bus, while the inlet and outlet of the heat exchanger is sealed with a gasket to elements of the chassis.

While the system of the '349 Patent provides a number of advantages over prior approaches, it nevertheless has some limitations. Cooling air from outside of the heat exchanger circulates from the inlet of the plenum to the opposite end of the heat exchanger, and then reverses direction in order to flow to the exhaust portion of the same plenum. This U-shaped flow path creates a relatively large pressure drop that reduces the heat transfer performance of the heat exchanger. Additionally, the use of a gasket to seal the inlet and outlet of the heat exchanger reduces the reliability of the system and creates a maintenance issue since the gaskets can be easily damaged and may require periodic replacement. Further, the circuit card/heat exchanger modules are provided with rails at each end which engage opposed slots formed in the end walls of the chassis to mount them in place. In order to readily permit installation of the modules in the chassis, the mating rails and slots cannot be constructed with tolerances which are too tight, and therefore the overall rigidity of the assembly is sacrificed to some extent and tolerance to vibration is reduced.

SUMMARY

This document concerns systems and methods for providing an electronic cooling apparatus. The electronic cooling apparatus comprises a chassis having an internal space that is sized and shaped to receive and structurally support circuit card(s). The internal space is defined by sidewalls with a channel formed therein. A coolant is disposed in the channel, and in thermal communication with the circuit card(s) via the sidewall(s) when the circuit card(s) is(are) disposed in the chassis. A refrigerant-based cooling system is disposed in the chassis and comprises an evaporator. The evaporator has an inlet port and an outlet port coupled to the channel of the chassis. A first closed-loop channel for the coolant is partially defined by the evaporator. For example, the first closed-loop channel may extend or otherwise passes through the evaporator. The evaporator is configured to (i) facilitate a transfer of heat from the coolant to a refrigerant flowing through a second closed-loop channel of the chassis, (ii) cause a non-linear flow of coolant from the inlet port to the outlet port, and (iii) have a non-uniform velocity distribution of the coolant through channels between the inlet port and outlet port. The second closed-loop channel is at least partially defined by the evaporator. For example, the second closed-loop channel may extend or otherwise passes through the evaporator. A pump is disposed in the chassis. The pump is configured to cause the coolant to flow through the first closed-loop channel.

Notably, both the first closed-loop channel and the second closed-loop channel reside entirely within the chassis. This feature of the present solution facilitates an improved electronic cooling apparatus, for example, that is less resource intensive, costly and location limited as compared to conventional systems employing external cooling systems (e.g., since the electronic cooling apparatus is not required to be mechanically coupled to an external coolant system). The electronic cooling apparatus is also much more efficient in terms of heat transfer as compared to conventional systems that simply employ air for cooling electronics.

In some scenarios, the chassis also comprises rails coupled to respective ones of the sidewalls. The rails are configured to directly contact the circuit card(s) when the circuit card(s) is(are) disposed in the chassis.

Additionally or alternatively, the evaporator may comprise layers of fins that have a stacked arrangement and are separated from each other by parting sheets. First and second ones of the layers of fins may be disposed in the first closed-loop channel, and a third one of the layers of fins may be disposed in the second closed-loop channel. The third layer of fins can reside between the first and second layers of fins.

The evaporator comprises a manifold located at an inlet port and/or an outlet port thereof. The manifold comprises a cavity having a trapezoidal shape that is defined by sidewalls of the manifold. The manifold further comprises a baffle disposed in the cavity. The baffle comprises spaced apart panels with variable spacing. The spacing between adjacent ones of the panels increases from a center of the baffle in opposing directions towards each end of the baffle. The center panel of the baffle may have dimension(s) smaller than that of another panel of the baffle.

An expansion value is coupled to the evaporator. Operations of the expansion valve are controllable based on, for example, a predicted heat load of the evaporator.

The present document also concerns methods for operating an electronic cooling apparatus. The methods comprise: receiving circuit card(s) in an internal space of a chassis of the electronic cooling apparatus in a manner that provides thermal communication between the circuit card(s) and the sidewall(s) of the chassis; circulating a coolant through a first closed-loop channel of the electronic cooling apparatus that is formed in the sidewall(s) of the chassis and extends through an evaporator disposed in the chassis; allowing heat to be transferred from the circuit card(s) to the coolant via the sidewall(s) of the chassis; causing the coolant which has been heated to flow into a portion of the first closed-loop channel that extends through the evaporator disposed in the chassis; allowing heat to be transferred from the coolant to a refrigerant flowing through a second closed-loop channel of the electronic cooling apparatus; using a manifold of the evaporator to provide a uniform velocity distribution of the coolant in the evaporator; and/or controlling operations of an expansion value to adjust an amount of refrigerant flow from the expansion value to the evaporator, based on a predicted heat load of the evaporator. The second closed-loop channel is at least partially defined by the evaporator and is entirely contained in the chassis.

The manifold may comprise a cavity having a trapezoidal shape and a baffle disposed in the cavity. The baffle may comprise spaced apart panels. The spacing between adjacent ones of the panels increases from a center of the baffle in opposing directions towards each end of the baffle. The portion of the first closed-loop channel that extends through the evaporator comprises a first layer of fins and a second layer of fins in a stacked arrangement. The first and second layers of fins are separated from each other by a third layer of fins which are contained in the second closed-loop channel.

BRIEF DESCRIPTION OF THE DRAWINGS

This disclosure is facilitated by reference to the following drawing figures, in which like numerals represent like items throughout the figures.

FIG. 13 provides an isometric view of an evaporator showing the location of the diffuser elements.

FIG. 19 provides a flow diagram of an illustrative method for operating a system.

DETAILED DESCRIPTION

Figure 1:
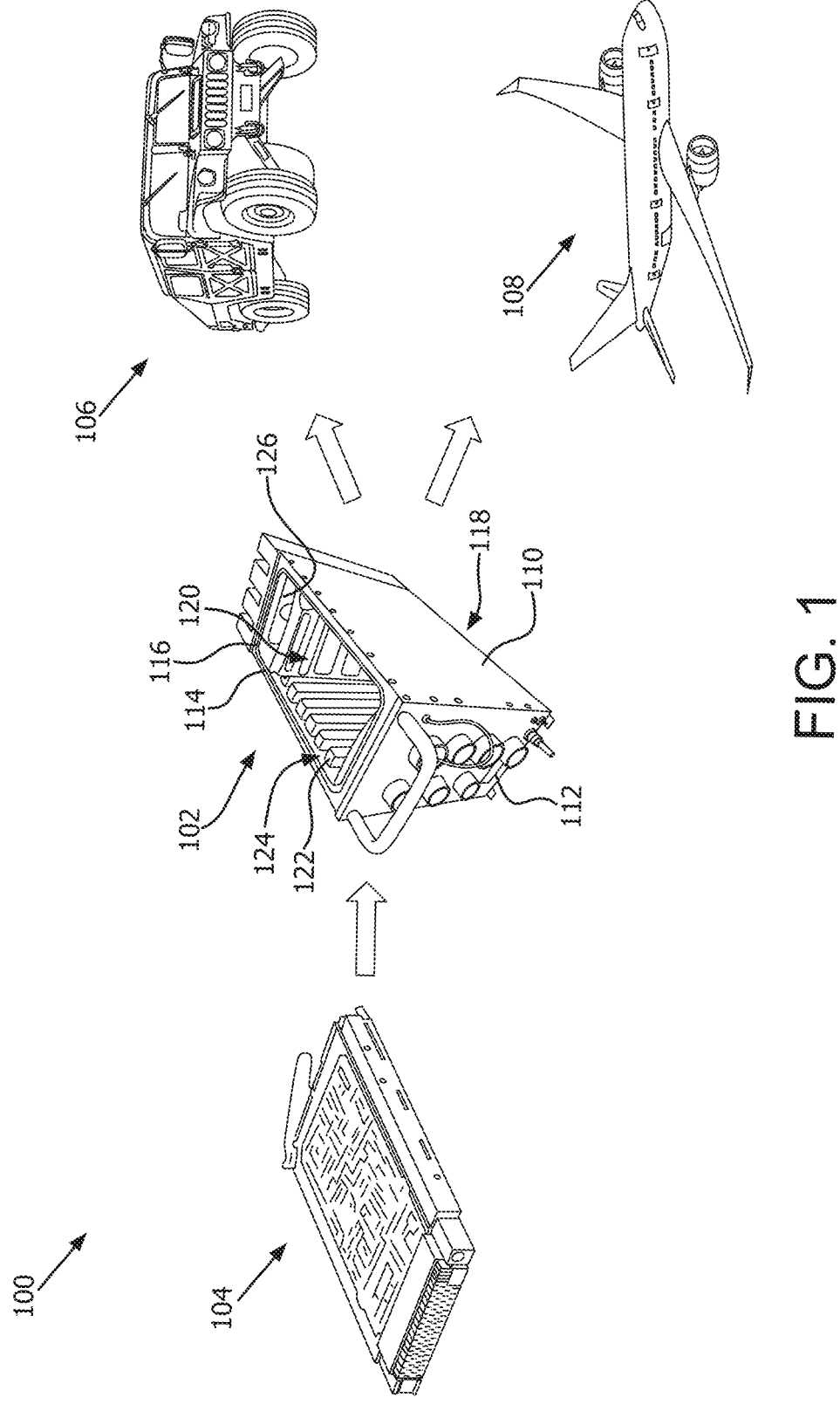
FIG. 1 provides an illustration of a system.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in different scenarios. While the various aspects are presented in the drawings, the drawings are not necessarily drawn to scale unless specifically indicated.

Reference throughout this specification to features, advantages, or similar language does not imply that all the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

A highly dense electronic package results in difficult thermal management issues. In such packaging, electronic components exceed their thermal design limits and parts display reduced reliability well before the maximum temperature limits. Current thermal management methods typically involve conduction cooling with ultimate heat rejection to air. Air flows in enclosed chassis systems are usually low with heat transfer coefficients creating a thermal bottleneck. Typical ambient air temperatures are up to approximately 55° C., which results in Printed Wiring Board (PWB) temperatures 30° C.-40° C. above the ambient temperature. Component junction temperatures may exceed 150° C. The present solution overcomes the drawbacks of conventional thermal management methods.

The present solution generally concerns systems and methods for housing and cooling circuit card assemblies employed in communication and other electronic systems. The systems comprise a chassis having a cavity defined by a plurality of sidewalls. Two of the side walls have a series of spaced rails disposed thereon, which define slots for circuit cards. A micro-refrigeration cooling system is disposed in the chassis to facilitate the cooling of internal circuit card assemblies.

The methods generally comprise: placing circuit card(s) in the chassis such that each circuit card is in thermal communication with a thermally conductive rail; causing a cooling fluid to flow from the micro-refrigeration cooling system through the thermally conductive rail; and using an evaporator to transfer heat from the circuit card(s) to the cooling fluid. The evaporator is configured to (i) facilitate a transfer of heat from the coolant to a refrigerant flowing through a second closed-loop channel of the chassis, (ii) cause a non-linear flow of coolant from the inlet port to the outlet port, and (iii) have a non-uniform velocity distribution of the coolant through channels between the inlet port and outlet port.

The present solution will be described below in relation to an electronic chassis (e.g., Air Transport Rack (ATR)) applications. The present solution is not limited in this regard and can be employed in other terrestrial and avionics applications.

Referring now to FIG. 1, there is provided an illustration of an illustrative system 100 implementing the present solution. System 100 comprises a chassis 102 in which circuit card(s) 104 can be disposed and housed. The chassis 102 may be carried in a vehicle. The vehicle can include, but is not limited to, land vehicles 106, aircraft 108, watercraft (not shown), subterrenes (not shown) and/or spacecraft.

The chassis 102 comprises a cavity 120 defined by sidewalls 110-116 and a bottom wall 118. A cover (not shown) can be provided to close and/or otherwise seal the cavity 120. Spaced rails 122 are provided on both sidewalls 110 and 114. The rails 122 facilitate (i) a guided insertion of circuit cards(s) 104 into slots 124, (ii) an alignment of the circuit cards in a parallel arrangement, (iii) the retention of the circuit cards 104 within the cavity 120, and (iii) the cooling of the circuit cards 104 during use. The rails 122 comprise structures that are formed of a thermally conductive material(s) (e.g., metal). When a circuit card 104 resides in a slot 124, the circuit card is in direct contact with respective ones of the rails. In effect, heat can be transferred from the circuit card to the rails.

A micro-refrigeration system 126 is provided adjacent to the cavity 120 of the chassis 102. The micro-refrigeration system 126 is configured to cause a fluid to flow through the rails 122. As the fluid flows through the rails, heat is transferred from the chassis 102 to the fluid. In this way, temperatures of the circuit boards can be maintained within their thermal design limits.

Figure 2:
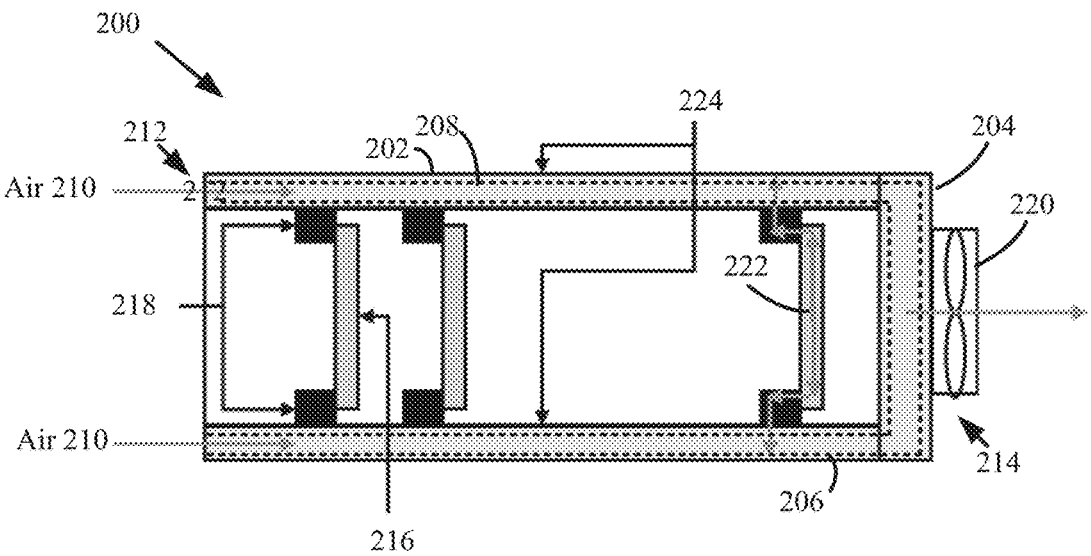
FIG. 2 provides an illustration of a conventional chassis with an air-based cooling system.

Referring now to FIG. 2, there is provided a top view of a conventional chassis 200 with an air-based cooling system. The chassis 200 comprises sidewalls 202, 204, 206 with a channel 208 formed therein. Finned heat sinks 224 can be disposed in, form or otherwise define the channel 208.

During operations, air 210 is caused by a fan 220 to enter the channel 208 at a first end 212 of the chassis 200 and flow through the channel 208 towards a second opposing end 214 of the chassis 200. The air is constrained by the sidewalls 202, 204, 206 as it flows through the channel 208. The air exits the channel 208 at the second opposing end 214 of the chassis 200.

As the air 210 flows through the channel 208, heat 222 is transferred from (i) the circuit board(s) 216 to the chassis sidewalls 202, 206 via rails 218, (ii) from the chassis sidewalls 202, 206 to the finned heat sinks 224, and (iii) from the finned heat sinks 224 to the air 210. The rails 218 are solid structures formed of a thermally conductive material (e.g., metal). The heat transfer results in a cooling of the chassis 200 and circuit board(s) 216. This air-based cooling process is limited by the heat capacity of air.

Figure 3:
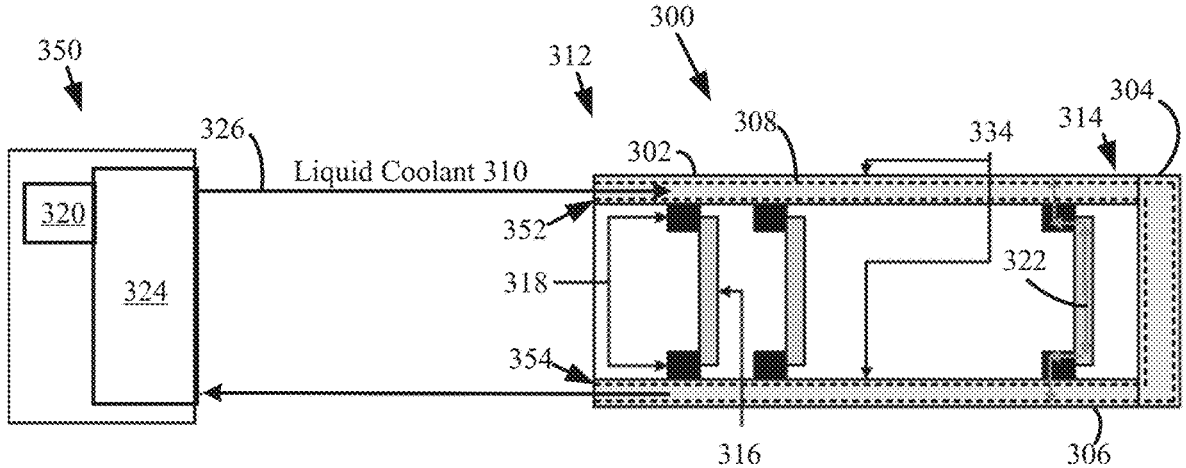
FIG. 3 provides an illustration of a conventional chassis coupled to an external liquid coolant-based cooling system.

Referring now to FIG. 3, there is provided a top view of another conventional chassis 300 coupled to an external liquid coolant-based cooling system 350. The chassis 300 comprises sidewalls 302, 304, 306 with a channel 308 formed therein. Finned heat sinks 324 can be disposed in, form or otherwise define the channel 308.

During operations, a liquid coolant 310 is cooled to a temperature below an ambient temperature and caused to flow from a reservoir 324 by a pump 320 of the system 350. The liquid coolant 310 then flows through tube 326 and, enters an inlet 352 of the channel 308 provided at a first end 312 of the chassis 300, circulates through the channel 308, and exits the channel 308 at the first end 312. The liquid coolant 310 has an increased temperature when it exits the channels 308. The heated liquid coolant 310 then flows back to system 350 where it is once again cooled.

As the liquid coolant 310 flows through the channel 308, heat 322 is transferred from (i) the circuit board(s) 316 to the chassis sidewalls 302, 306 via rails 318, (ii) from the chassis sidewalls 302, 306 to the finned heat sinks 334, and (iii) from the finned heat sinks 324 to the liquid coolant 310. The rails 318 are solid structures formed of a thermally conductive material (e.g., metal). The heat transfer results in a cooling of the chassis 300 and circuit board(s) 316. Although the liquid coolant has a greater heat capacity then air, this cooling process is relatively resource intensive and location restricted since the liquid coolant 310 is stored and pumped to/from a reservoir 324 of the vehicle.

Figure 4:
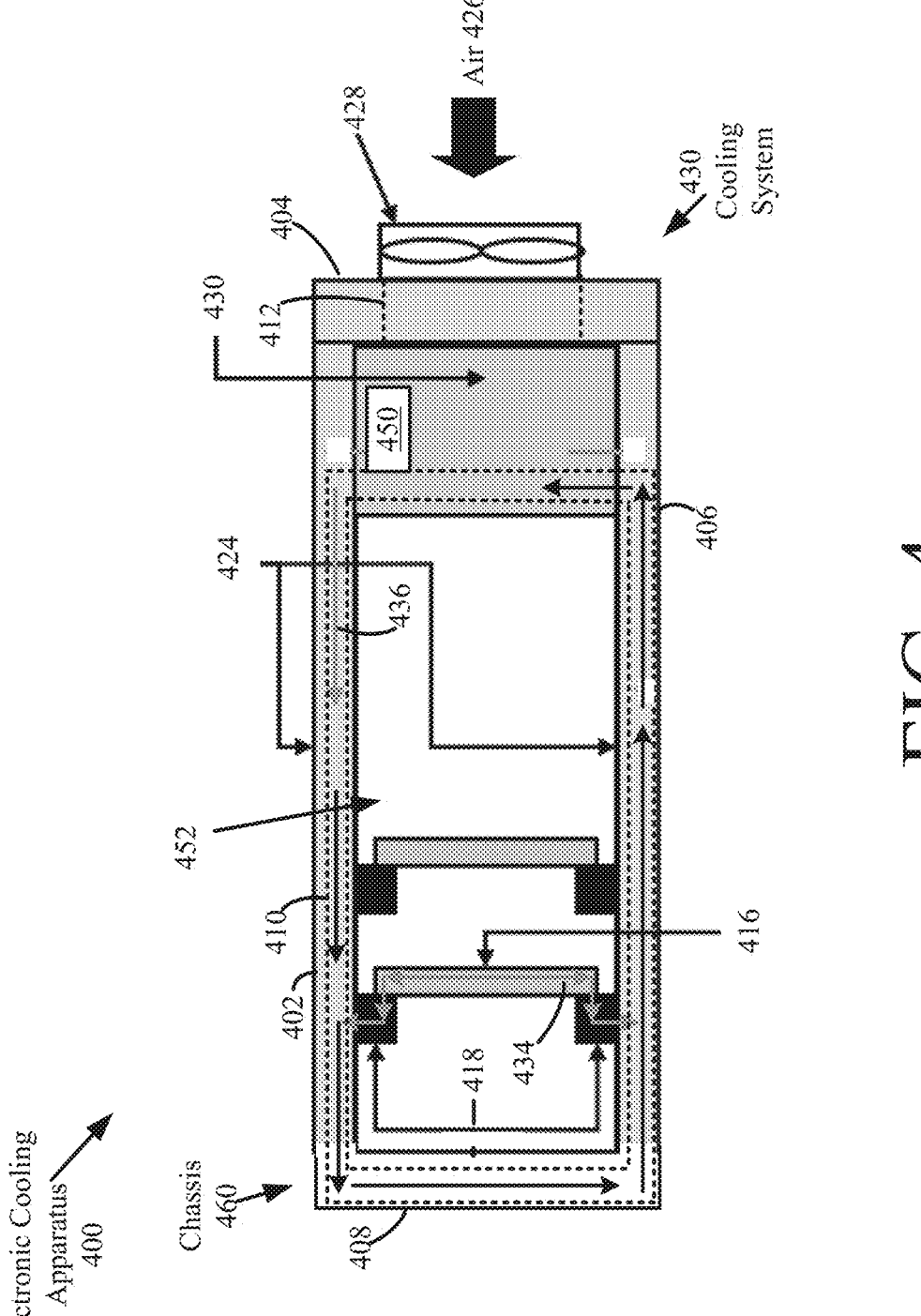
FIG. 4 provides an illustration of a chassis with a cooling system in accordance with the present solution.

Referring now to FIG. 4, there is provided a top view of an electronic cooling apparatus 400 implementing the present solution. The electronic cooling apparatus comprises a chassis 460 with sidewalls 402, 404, 406, 408. A closed loop channel 410 is formed in sidewalls 402, 406, 408. Finned heat sinks 424 can be disposed in, form or otherwise define the channel 410. Circuit card(s) 416 are removably disposed in an internal space 452 of the chassis 460 so as to have a parallel arrangement. Each circuit card is in direct contact with respective rails 418. The rails 418 are formed of a thermally conductive material (e.g., metal) and configured to transfer heat from the circuit card(s) to the chassis sidewalls 402, 406. In some scenarios, couplers (not shown) (e.g., wedge clamps or bolts) are provided to secure the circuit card(s) to the rails 418. A plate (not shown) can be coupled to the circuit board to provide an interface with the chassis. The plate may be angled relative to the circuit board.

During operations, ambient air 426 is caused by a fan 428 to enter the chassis 460 via an aperture 412 formed in sidewall 404. The ambient air 426 is used to cool a refrigerant of a refrigerant-based cooling system 430 disposed within the chassis 460. The refrigerant (not shown in FIG. 4) is used to cool a coolant 436 as it circulates through channel 410 of the chassis 460. A pump 450 is provided to facilitate the circulation and recirculation of the coolant 436 through channel 410. The pump 450 can be provided as part of the cooling system 430 (as shown) or external to the cooling system 430 (not shown).

The liquid cooling of chassis 460 offers certain advantages. For example, the heat capacity of the liquid is higher than air, and therefore flow rates are low. The heat transfer coefficient of the liquid is high reducing convective thermal resistance. The fluid can be cooled below ambient temperature.

Figure 5:
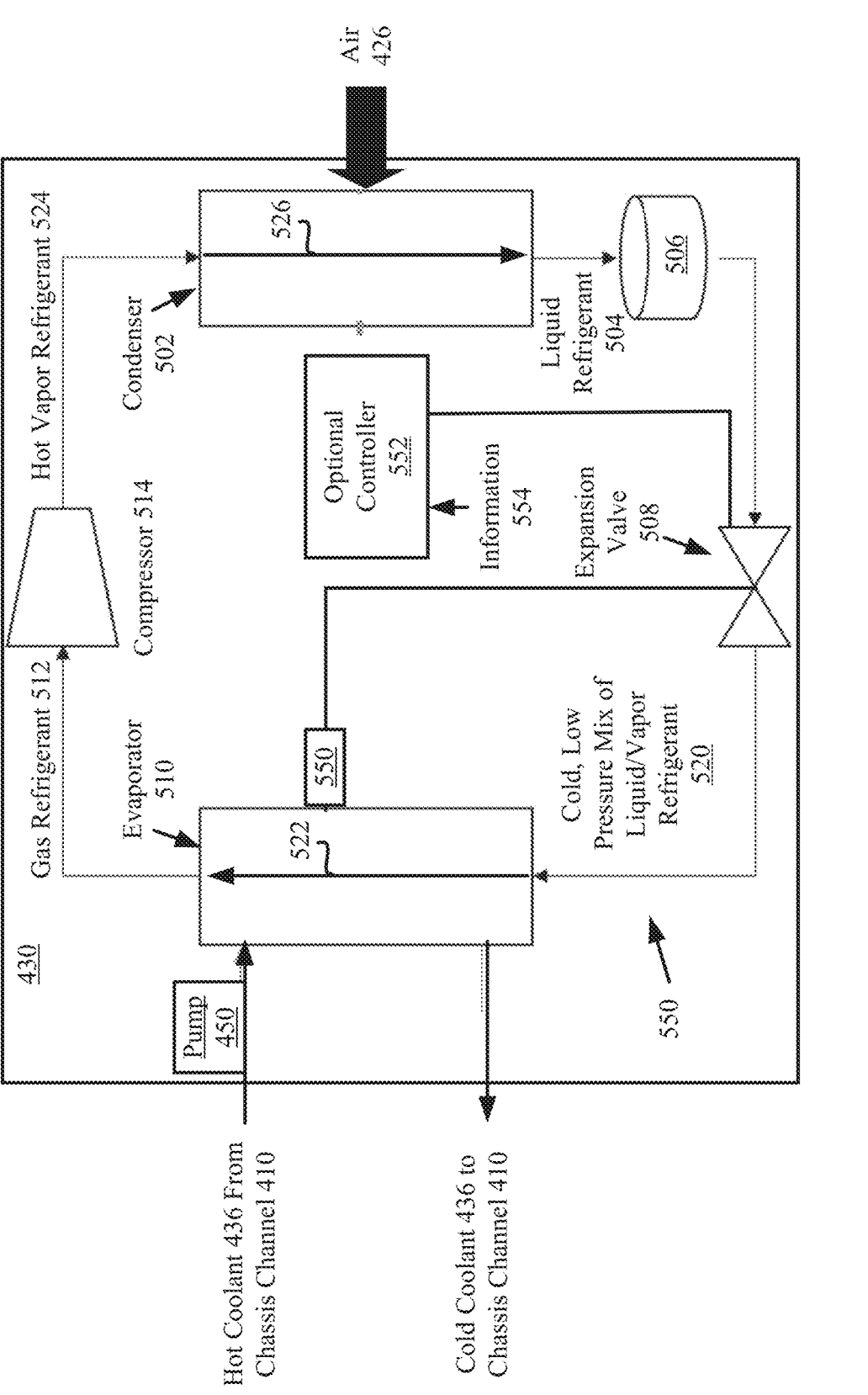
FIG. 5 provides a block diagram of the cooling system shown in FIG. 4.

The manner in which the refrigerant is cooled using ambient air 426 will now be described in relation to FIG. 5. As shown in FIG. 5, cooling system 430 comprises a condenser 502, an accumulator 506, an expansion valve 508, an evaporator 510, a compressor 514, sensors 550 and an optional controller 552. Compressors are well known. Any known or to be known compressor can be used here.

During operation, a refrigerant 504 is output from the condenser 502 as a hot liquid and is accumulated in an accumulator 506. The refrigerant 504 can include any fluid that has a relatively high ambient temperature and benefits from compressor operation. Such fluids include, but are not limited to, ammonia, butane and/or other natural refrigerants which have relatively low environmental impact. The accumulator 20 may include, but is not limited to, a suction accumulator and/or a capillary tube. The suction accumulator is generally configured to prevent liquid refrigerant from flowing back into to the condenser 502.

The refrigerant flows from the accumulator 506 to the expansion valve 508 where a pressure thereof is decreased. When the refrigerant's pressure is decreased, a portion of the liquid refrigerant evaporates whereby a temperature of the remaining portion of the liquid refrigerant flowing through the expansion valve 508 is decreased. The pressure drop inside the expansion valve 508 can be, but is not limited to, 15-60 Psi (e.g., 30 Psi). The output of the expansion valve 508 is a cold low-pressure mix of liquid and vapor refrigerant 520. The cold low-pressure refrigerant mix 520 flows from the expansion valve 508 to the evaporator 510. The evaporator 510 is configured to (i) facilitate a transfer of heat from the coolant to a refrigerant flowing through a second closed-loop channel of the chassis, (ii) cause a non-linear flow of coolant from the inlet port to the outlet port, and (iii) have a non-uniform velocity distribution of the coolant through channels between the inlet port and outlet port.

At the evaporator 510, the hot coolant 436 from the chassis 410 passes over the tubing 522 inside the evaporator 510 through which the refrigerant mix 520 flows. Fins can be provided with the tubing 522 over which the hot coolant 436 passes. In effect, the refrigerant mix 520 is heated whereby the remaining liquid portion thereof is vaporized. When the refrigerant leaves the evaporator 510, it is in a gas state. The gas refrigerant 512 flows into the compressor 514 which increases the pressure and temperature of the gas refrigerant 512. The output of the compressor 514 is a hot vapor refrigerant 524. The hot vapor refrigerant 524 flows to the condenser 502. At the condenser 502, the fan 428 blows ambient air 426 (which is at a cooler temperature than the hot vapor refrigerant 524) across the tubing 526 inside the condenser 502. Fins can be provided with the tubing 526 over which the air 426 passes. In effect, the refrigerant condenses inside the condenser 502 and transitions to a hot high-pressure liquid state. The refrigerant in the hot high-pressure liquid state is referred to herein as liquid refrigerant 504.

The above described refrigerant cycle of the cooling system 430 provides a closed refrigerant loop. As the heat load on the system 420 changes, the mass flow of the gas through the refrigerant cycle needs to change. The accumulator 506 acts as a capacitor for holding the refrigerant fluid. The expansion valve 508 facilitates the control of the amount of refrigerant flow to the evaporator 510 based on how much the refrigerant gas is super-heated inside the evaporator. Accordingly, there is a feedback from the outlet side of the evaporator 510 to the expansion valve 508. A differential temperature sensor 550 is provided to measure the difference between a temperature of the gas refrigerant 512 and a temperature of the cold, low-pressure mix 520. The difference represents an amount of super-heat which is fed-back to the expansion valve 508 to control the amount of mass flow of the refrigerant flowing through the system 430. Consequently, operations of 430 are passively modified in real time to account for variations in the ambient environment.

In some scenarios, an optional controller 552 is provided with system 430. The controller 552 can be configured to monitor the usage levels of the electronics on the circuit cards 416 to predict what the amount of heat load of the evaporator will be at a given time. The predicted heat load can then be used to control operations of the expansion valve 508 to improve the responsiveness of the system 420 to variations in the ambient environment. The power usage level monitoring can be facilitated by various information 554 provided to the controller from the circuit cards 416 and/or other devices external to system 430. The information 554 can include, but is not limited to, power usage of the electronics of the circuit cards, time of year, time of day, type of vehicle, mission parameters and/or any other information that can affect the electronic power dissipation. Machine learning model(s) can be used to detect pattern(s) in the information 554 that can indicate a likely power usage by the electronics of the circuit cards 416.

Figure 6:
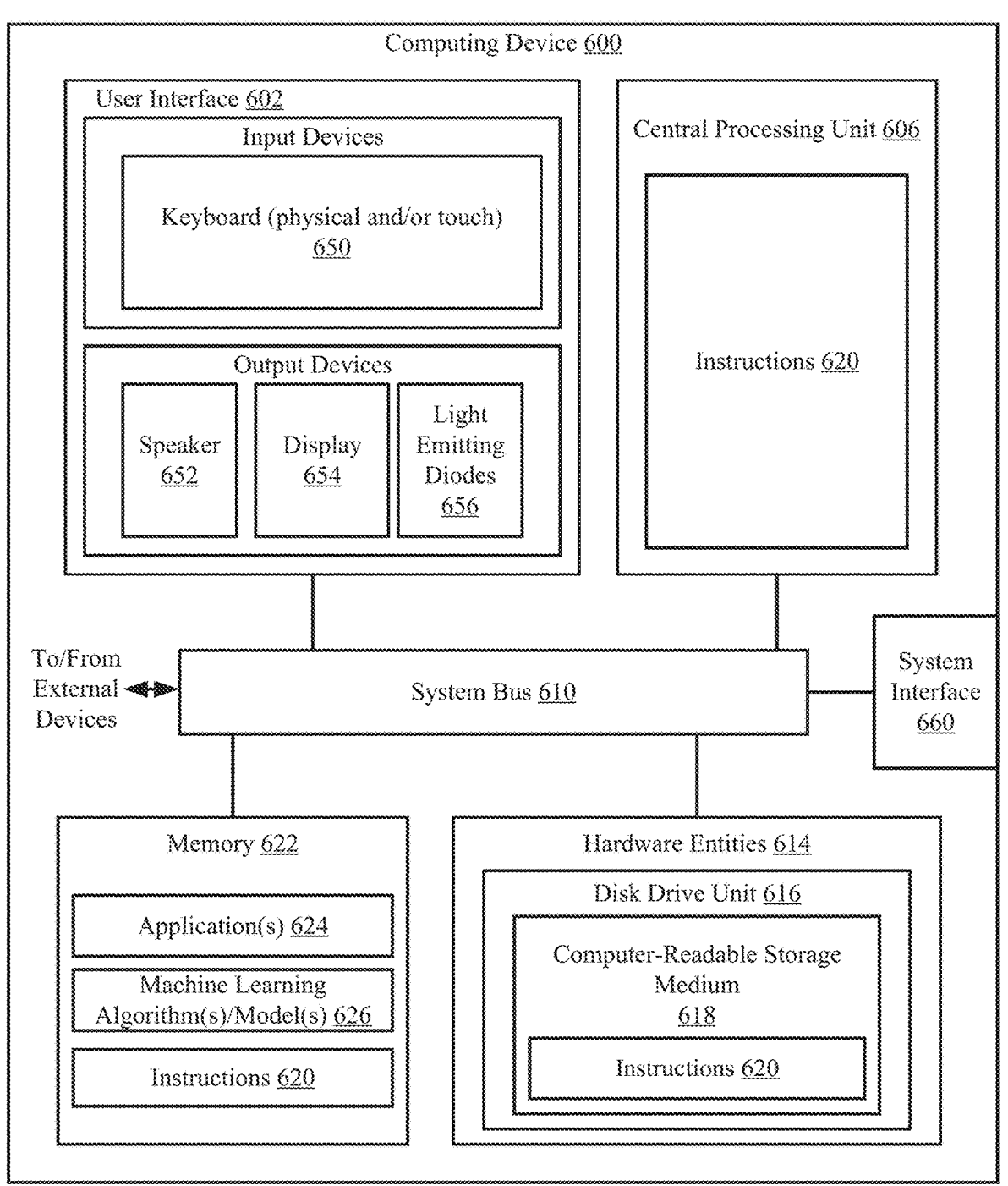
FIG. 6 provides block diagram of an illustrative computing device.

Referring now to FIG. 6, there is provided a hardware block diagram comprising an illustrative computing device 600. Electronics of circuit cards 416 shown in FIG. 4 and/or controller 552 of FIG. 5 can be the same as or substantially similar to computing device 600. As such, the discussion of computing device 600 is sufficient for understanding the circuit card electronics 416 of FIG. 4 and/or controller 552 of FIG. 5.

Computing device 600 may include more or less components than those shown in FIG. 6. However, the components shown are sufficient to disclose an illustrative solution implementing the present invention. The hardware architecture of FIG. 6 represents one implementation of a representative computing device configured to enable cooling system operations as described herein. As such, the computing device 600 of FIG. 6 implements at least a portion of the method(s) described herein.

Some or all the components of the computing device 600 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 6, the computing device 600 comprises a user interface 602, a Central Processing Unit (CPU) 606, a system bus 610, a memory 622 connected to and accessible by other portions of computing device 600 through system bus 610, and hardware entities 614 connected to system bus 610. The user interface can include input devices (e.g., a keypad 650) and output devices (e.g., a speaker 652, a display 654, and/or light emitting diodes 656), which facilitate user-software interactions for controlling operations of the computing device 600.

At least some of the hardware entities 614 perform actions involving access to and use of memory 622, which can be a RAM, a disk driver and/or a CD-ROM. Hardware entities 614 can include a disk drive unit 616 comprising a computer-readable storage medium 618 on which is stored one or more sets of instructions 620 (e.g., software code) configured to implement one or more of the methodologies, procedures, or functions described herein. The instructions 620 can also reside, completely or at least partially, within the memory 622 and/or within the CPU 606 during execution thereof by the computing device 600. The memory 622 and the CPU 606 also can constitute machine-readable media. The term "machine-readable media", as used here, refers to a single medium or multiple media (e.g., a centralized or distributed database, and/or associated caches and servers) that store the one or more sets of instructions 620. The term "machine-readable media", as used here, also refers to any medium that is capable of storing, encoding or carrying a set of instructions 620 for execution by the computing device 600 and that cause the computing device 600 to perform any one or more of the methodologies of the present disclosure.

In some scenarios, the hardware entities 614 include an electronic circuit (e.g., a processor) programmed for facilitating cooling system control. In this regard, it should be understood that the electronic circuit can access and run application(s) 624 and/or a machine learning application(s) 626 installed on the computing device 600.

The machine learning application(s) 626 may implement AI that provides the computing device 600 with the ability to automatically learn and improve data analytics from experience without being explicitly programmed. The machine learning application(s) employ(s) one or more machine learning algorithms that learn various information from accessed data (e.g., via pattern recognition and prediction making). Machine learning algorithms are well known in the art. For example, in some scenarios, the machine learning application 626 employs a supervised learning algorithm, an unsupervised learning algorithm, and/or a semi-supervised algorithm. The learning algorithm(s) is(are) used to model frequency decisions based on data analysis (e.g., captured sensor information and other information).

Figure 7:
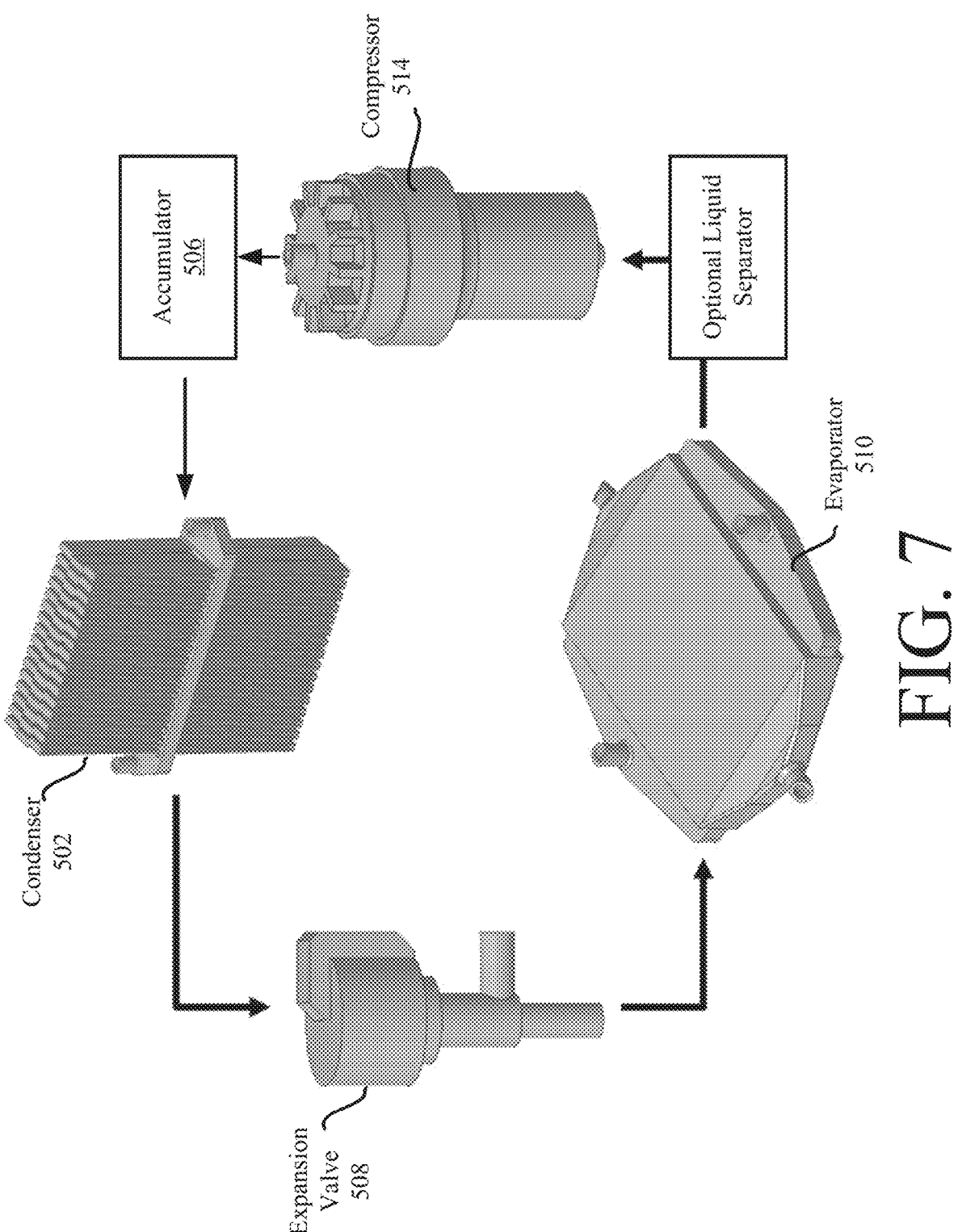
FIG. 7 provides an illustration of a refrigerant cycle.
Figure 8:
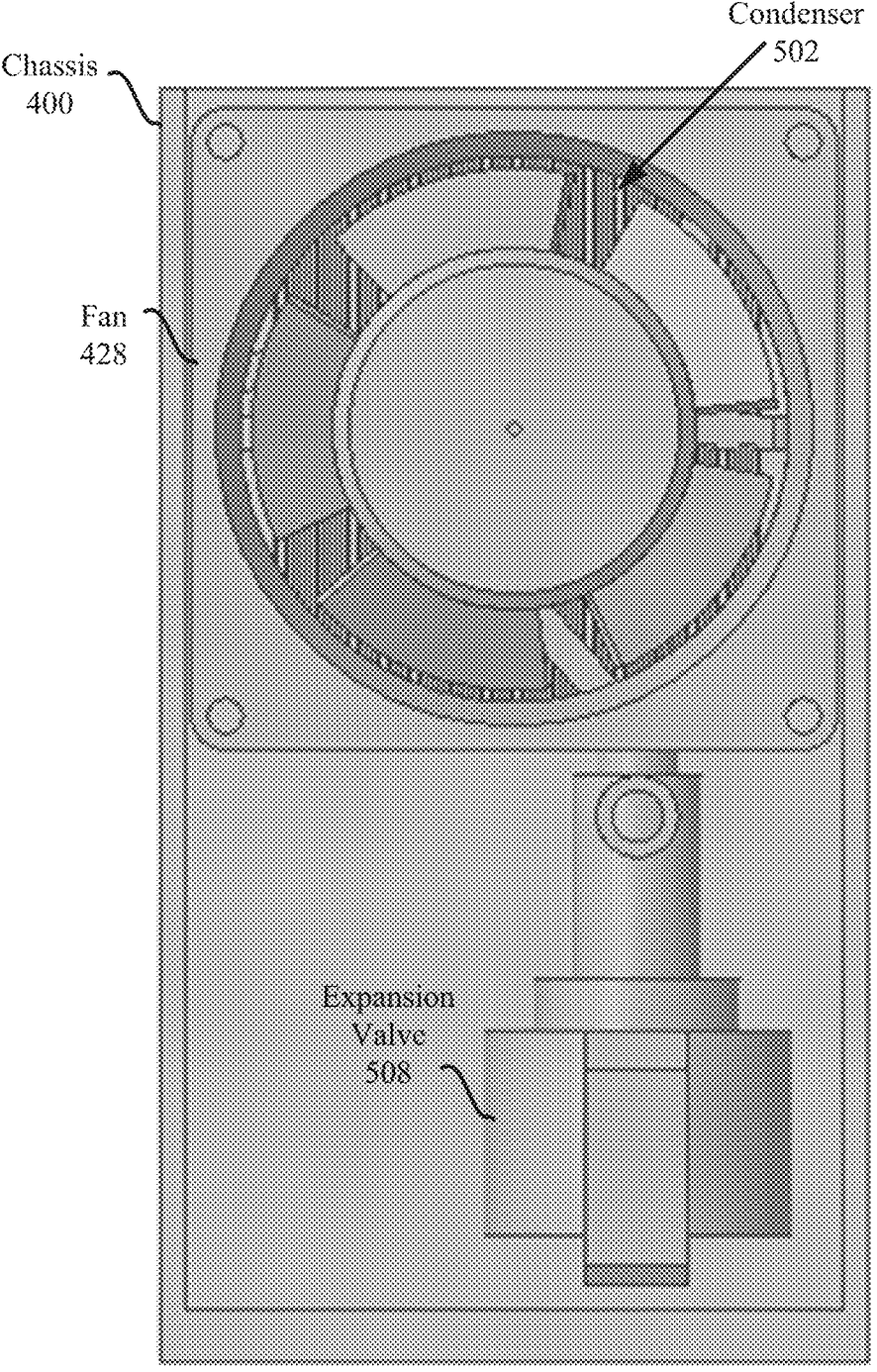
FIG. 8 provides a rear view of the chassis with a fan and cooling system coupled thereto.

Referring now to FIG. 7, there is provided an illustration showing more detailed perspective views of the components 502, 506, 508, 510, 514 contained in the refrigerant cycle of the cooling system 430. The expansion valve 508 is disposed outside of the chassis 460 as shown in FIG. 8. The condenser

502 is disposed inside the chassis 460 such that it is vertically and horizontally aligned with fan 428 (which is disposed outside of chassis 460). This alignment ensures that the fan 438 will blow air across the condenser 502 in a manner that will cause an optimized cooling of the refrigerant flowing through the condenser by the ambient air. An optional protective cover (not shown) can be provided for the expansion valve 508 and/or fan 438.

The evaporator 510 has a novel design to facilitate the implementation of the cooling system in a relatively small chassis profile. The novel design will now be discussed in detail in relation to FIGS. 9-14.

Figure 9:
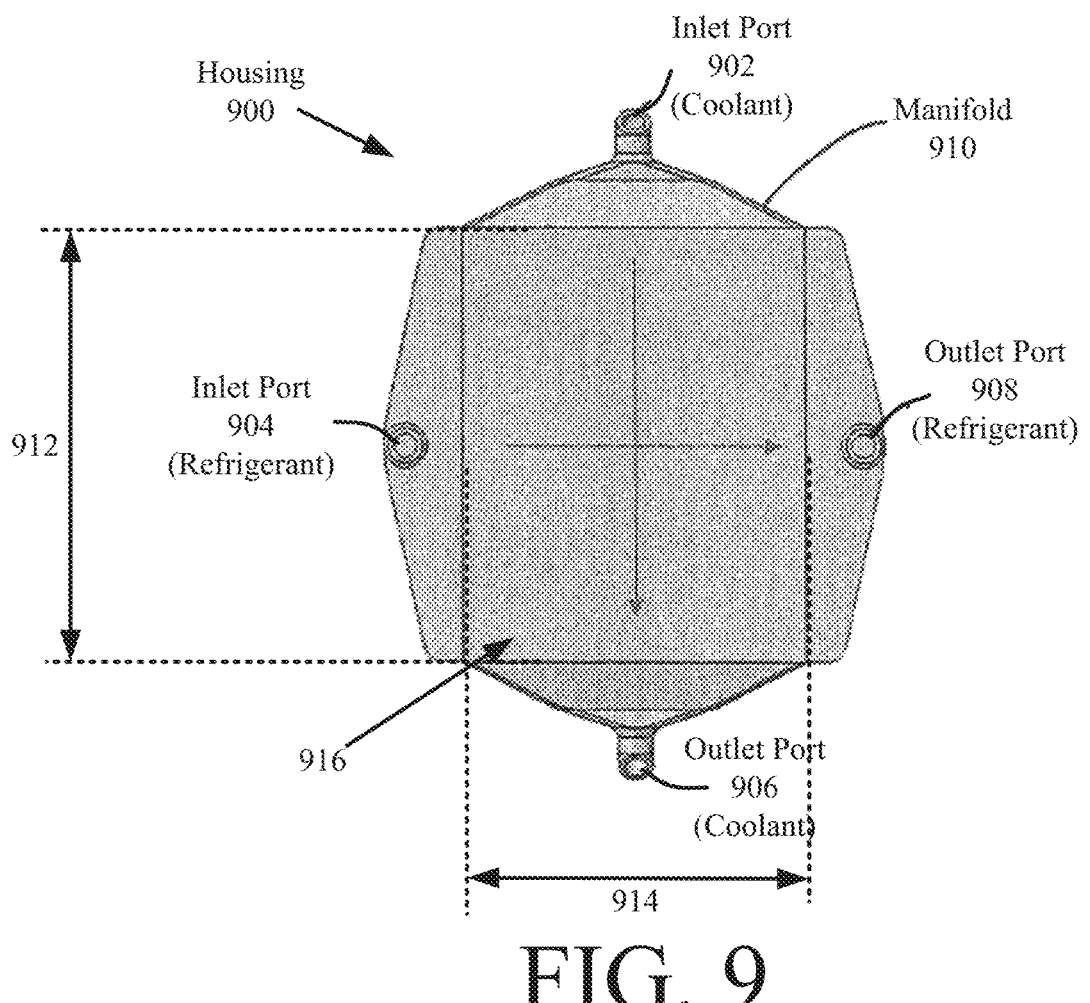
FIG. 9 provides a top view of an evaporator.

A top view of the evaporator 510 is provided in FIG. 9. As shown in FIG. 9, the evaporator 510 comprises a housing 900. The housing 900 can have dimension selected in accordance with a given application. For example, the housing 900 may have a main body 916 with a width 912 and length 914 between 1-5 includes (e.g., a width of 1.75 inches and a height 2.25 inches). The present solution is not limited to the particulars of this example.

Inlet ports 902, 904 and outlet ports 906, 908 are coupled to the main body 916. The coolant 436 enters the evaporator 510 via inlet port 902 and exits the evaporator 510 via outlet port 906. The refrigerant 520 enters the evaporator 510 via inlet port 904 and exits the evaporator 510 via outlet port 908. A manifold 910 is provided adjacent to each port. The manifold 910 will be described in detail below. Still, it should be noted here that the manifold 910 is generally configured to control the inlet/outlet flow and pressures.

The evaporator 510 can be formed of a metal (e.g., aluminum) that is vacuum brazed. Vacuum brazing is a manufacturing process for joining components by heating a braze alloy between the assembly components. The vacuum brazing minimizes any residual stress and distortion of the evaporator 510.

Figure 10:
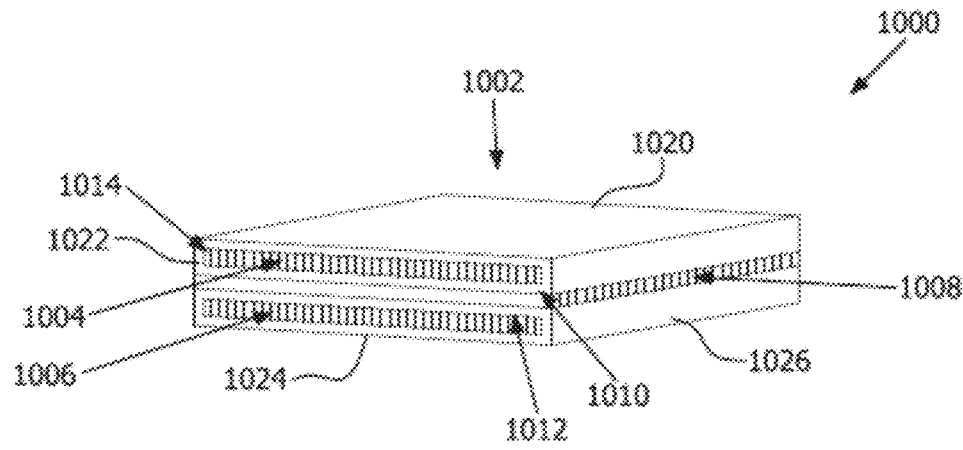
FIG. 10 provides a perspective view of an internal structure of the evaporator shown in FIG. 9.

An illustration of the internal structure 1000 of the evaporator 510 is provided in FIG. 10. As shown in FIG. 10, the internal structure 1000 comprises a housing 1002 define by four sidewalls 1020, 1022, 1024, 1026. The sidewalls can have a relatively thin thickness (e.g., 30-80 mils). At least three layers of fins 1004, 1006, 1008 are disposed in the housing 1002 in a stacked arrangement. Fin layers 1004, 1008 are separated from each other by a plate 1010. Similarly, fin layers 1006, 1008 are separated from each other by a parting sheet 1012 and/or side bars 1014. The parting sheets 1010, 1012 and side bars 1012 ensure that (i) the coolant does not mix with the refrigerant and (ii) heat can be transferred from the coolant to the refrigerant. The coolant flows through fins of layers 1004, 1006, while the refrigerant flows through the fins of layer 1008.

The internal pressure of structure 1000 may include, but is not limited to, 100-400 psi. In conventional systems, the internal pressure of an evaporator is between 30-50 psi. The total number of fins in layers 1004 and 1006 may be the same (e.g., 75-100 fins). The total number of fins in layer 1008 can be the same as or different than (e.g., less than) that of layers 1004, 1006.

Figure 11:
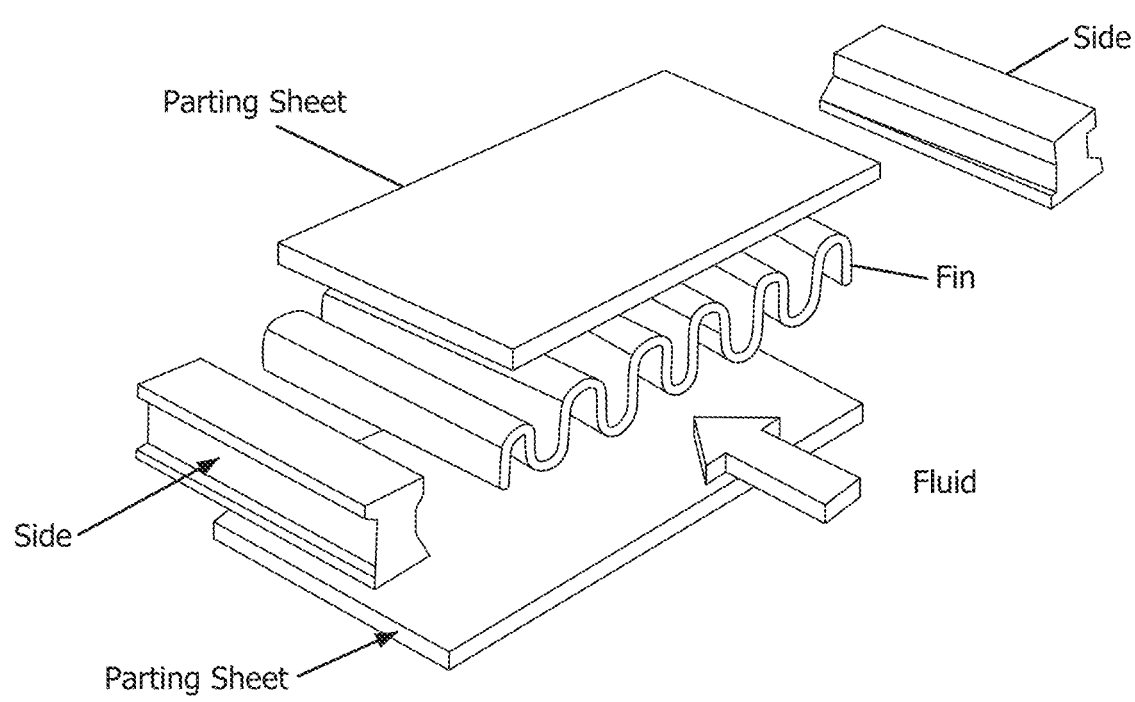
FIG. 11 provides an illustration that is useful for understanding a fin structure.
Figure 12:
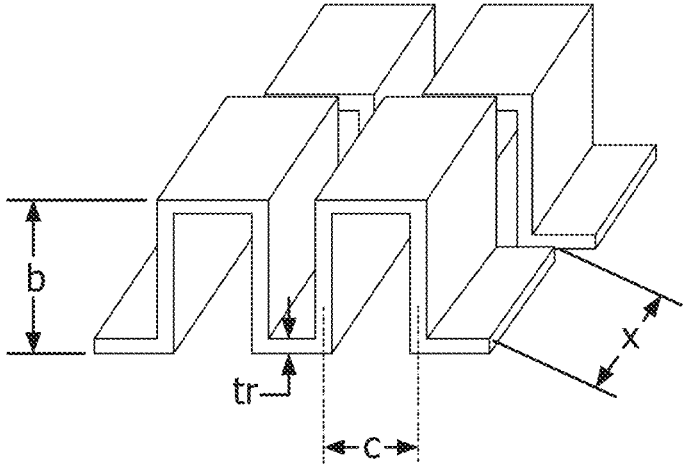
FIG. 12 provides an illustration of the manifold shown in FIG. 9.

A more detailed illustration is provided in FIG. 11 that is useful for understanding the architecture of a given fin layer (e.g., fins in sidewalls of chassis 460 of FIG. 4 or fin layer 1004, 1006, 1008 of FIG. 10). The fin layer comprises a single layer of rectangular strip fins having a parallel arrangement. The present solution is not limited to the strip fins design of FIG. 11. Other fin designs can be employed such as an offset strip fin arrangement shown in FIG. 12. The fin design can be selected in accordance with any given application. For example, the offset strip fin design of FIG.

12 is selected for maximizing a heat transfer surface area and minimizing the weight and volume of the structure. Each fin can have a height b (e.g., 60-100 mils), a thickness $t_f$ (e.g., 5-20 mils), a length x and a spacing c (e.g., 20-40 mils) from an adjacent fin. The fins can be formed of any suitable material such as aluminum or copper.

Figure 13:
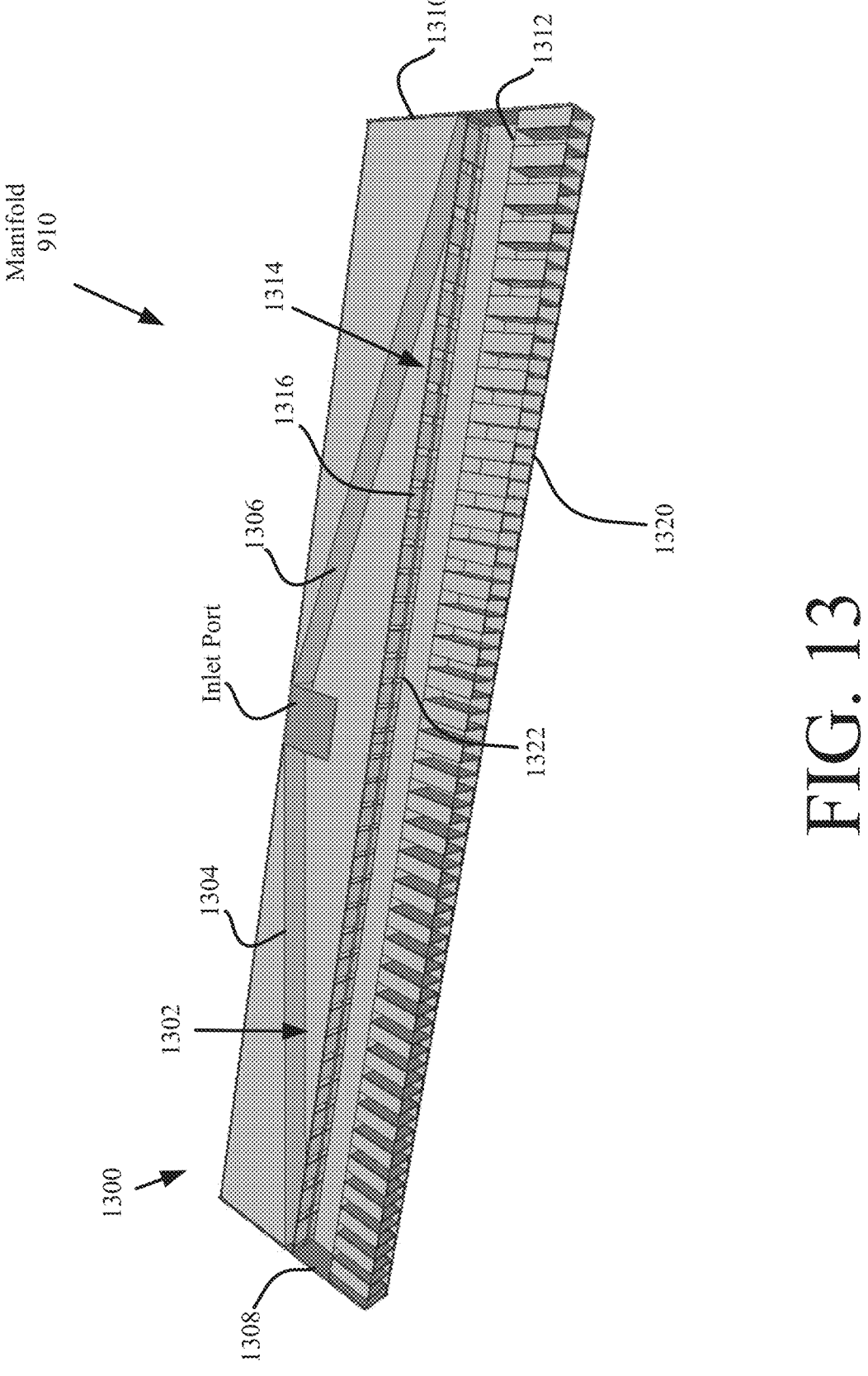
FIG. 13 provides an exploded view of the cooling fins disposed in the evaporator of the cooling system.

Referring now to FIG. 13, there is provided a more detailed illustration of the manifold 910. The manifold 910 is designed to ensure that the fluid flows evenly from the inlet port (e.g., inlet port 902 of FIG. 9) through the main body 916 of the evaporator or from the main body 916 of the evaporator to the outlet port (e.g., outlet port 906 of FIG. 9). In this regard, the manifold 910 comprises a structure 1300 with a cavity 1302 formed therein. The cavity 1302 is defined by sidewalls 1304, 1306, 1308, 1310, 1312. Sidewalls 1304 and 1306 are angled or sloped whereby the cavity is provided with a generally trapezoidal shape. A baffle 1314 is disposed in the cavity 1302. The baffle 1314 is configured to direct the flow of the fluid from the inlet port to the channels 1320 of sidewall 1312 with relatively minimal pressure drop and a uniform velocity distribution.

Figure 14:
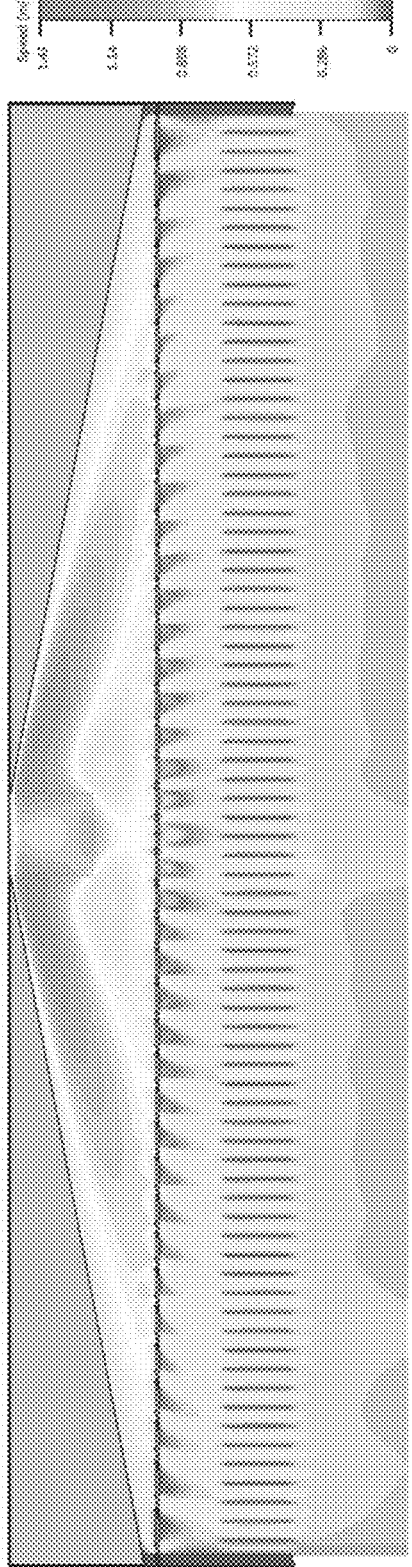
FIG. 14 provides an illustration of a diffuser element.
Figure 15:
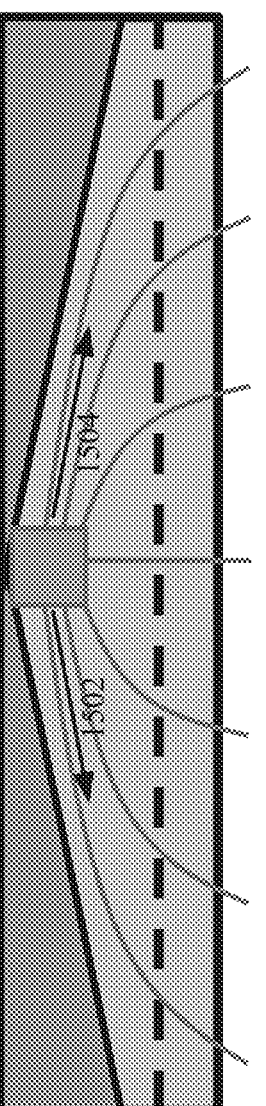
FIG. 15 provides an illustration showing fluid flow through the diffuser element.

Illustrations showing the flow of a fluid through the baffle 1314 is provided in FIG. 14 and FIG. 15. As shown in FIGS. 14-15, the fluid flow is symmetrical about the middle of the manifold. The fluid was allowed to flow in both directions 1502, 1504 simultaneously. The angles of the sidewalls 1304, 1306 are selected to facilitate minimization of flow maldistribution. The triangular configuration of the sidewalls 1304, 1306 forces an even or nearly even fluid flow through the multitude of channels 1322 of the baffle 1314.

The flow-directing feature of the baffle 1314 is achieved via a plurality of spaced apart panels 1316. An illustration is provided in FIG. 16 that is useful for understanding the baffle architecture. The baffle can have a length 1630 (e.g., 2.7 inches) that is selected in accordance with a given application. The panels 1316 have the same height 1600 (e.g., 60-80 mils) but have widths 1620 that may vary from the center 1604 of the baffle in both directions 1606, 1608 towards ends 1610, 1612. For example, the center panels 1614, 1616 have the same width as each other. This width is smaller than the width of the other panels such as panel 1632. The spacing between the panels also varies such as by increasing in size in both directions 1606, 1608 starting from the center 1604 of the baffle. For example, a space 1618 (e.g., 5-15 mils) is smaller than spaces 1620 (e.g., 20-30 miles), 1622 (e.g., 30-70 mils). The innermost space 1618 is the smallest space between adjacent panels, while the outermost space 1622 is the largest space between adjacent panels. The uneven spacing facilitates pressure normalization for flow evenness. The flow evenness and pressure normalization makes the evaporator work effective and efficiently.

Figure 16:
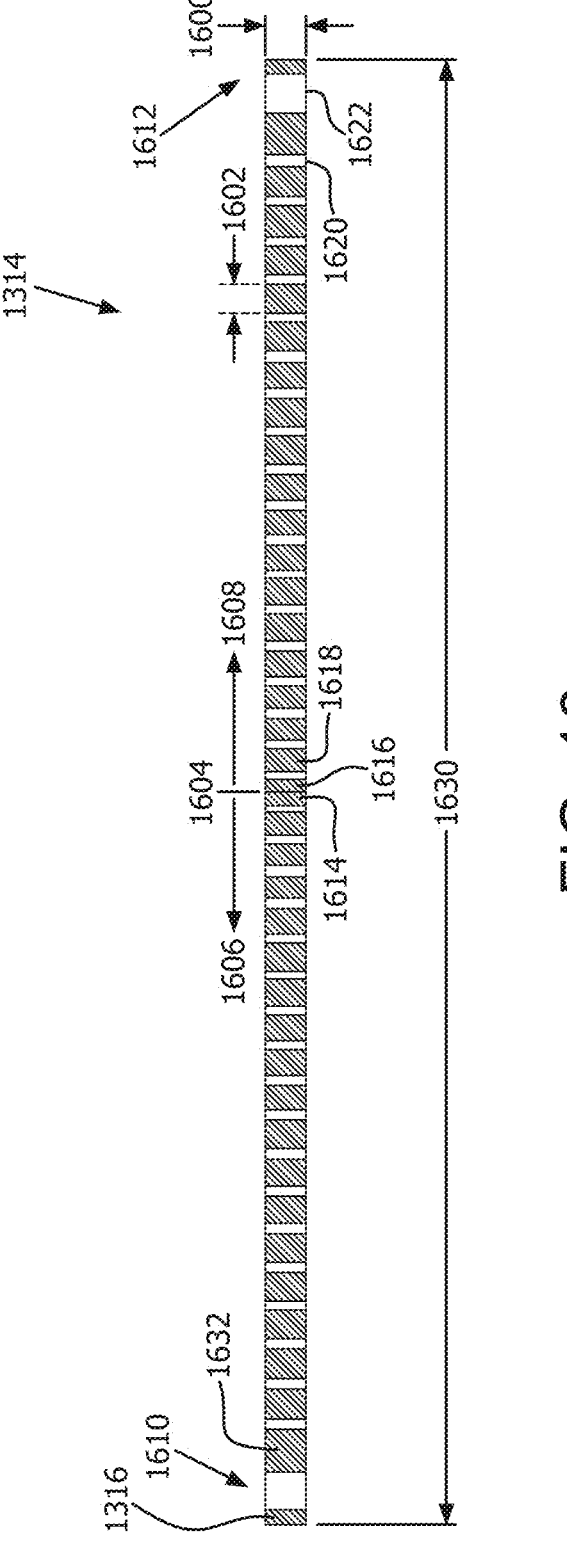
FIG. 16 provides an illustration of a condenser.
Figure 17:
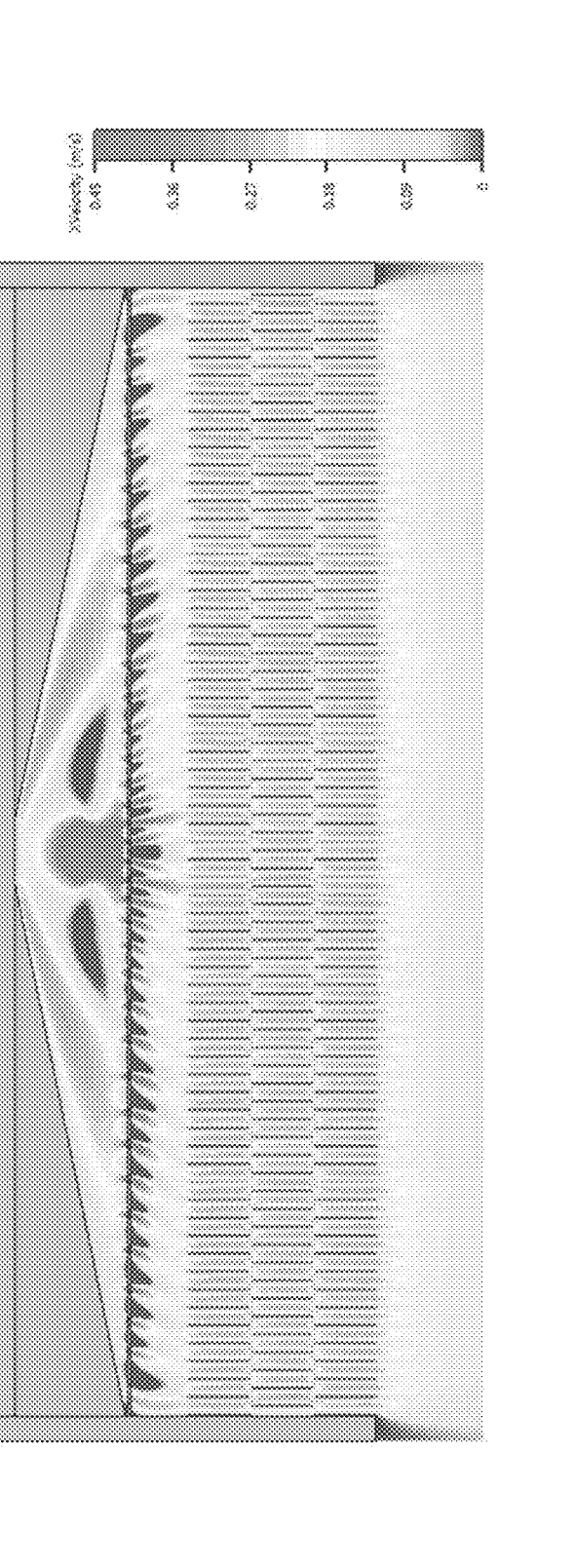
FIG. 17 provides an illustration of a baffle architecture.

The present solution is not limited to the particular baffle architecture shown in FIG. 16. For example, the baffle can have the architecture shown in FIG. 17.

Figure 18:
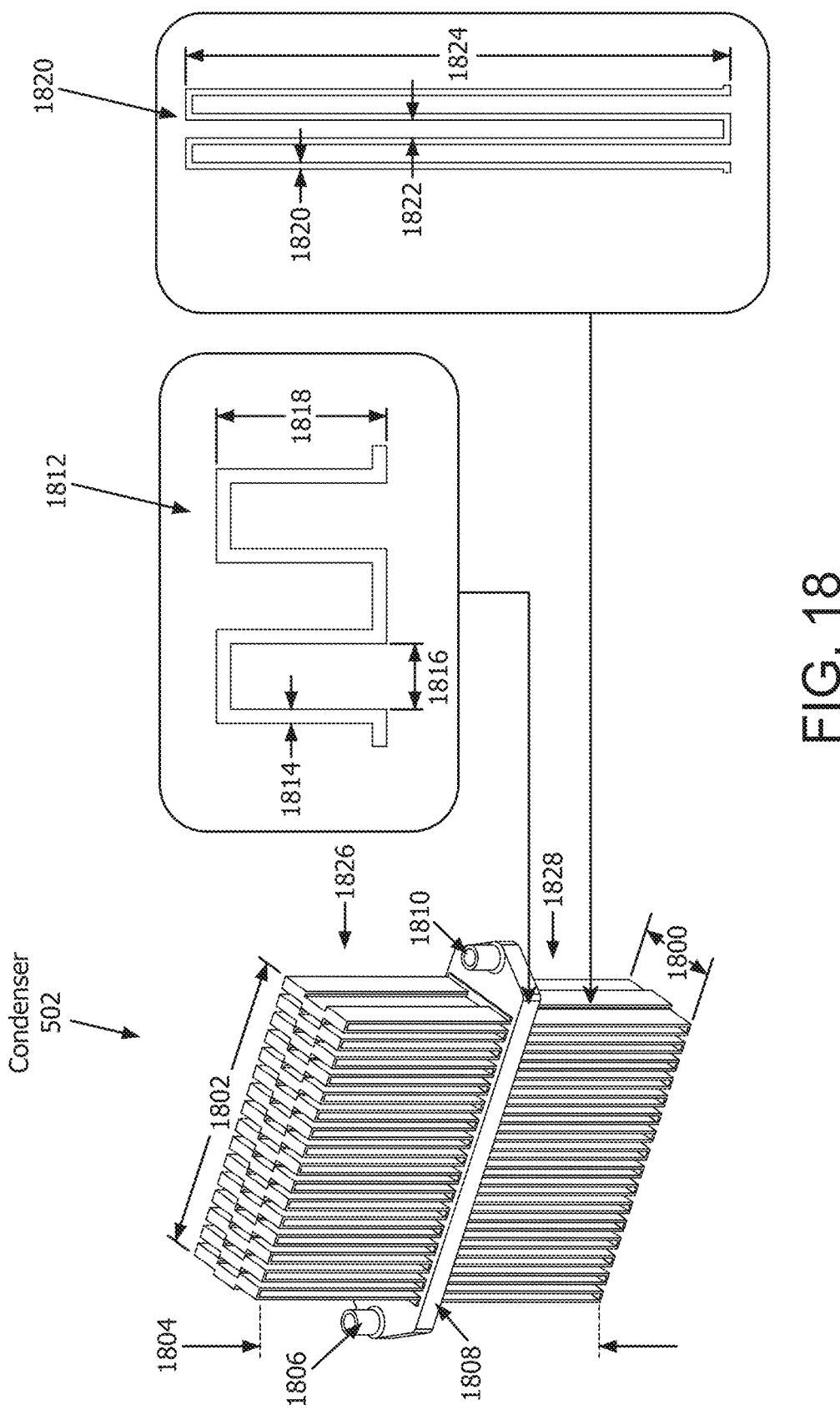
FIG. 18 provides an illustration that is useful for understanding the architecture of a condenser.

Referring now to FIG. 18, there is provided an illustration that is useful for understanding the architecture of the condenser 502. The condenser 502 can have a width 1800 (e.g., 0.75 inches), a length 1802 (e.g., 2.4 inches) and a height 1804 (e.g., 3.7 inches). An inlet port 1806 is provided for receiving the refrigerant in a compartment 1808 of the condenser 502. The refrigerant flows through the compartment 1808 and exits the condenser 502 via outlet port 1810. Fins 1812 are disposed within compartment 1808. The fins 1812 have different dimensions 1814, 1816, 1818 than the dimensions 1820, 1822, 1824 of fins 1820 of upper and lower portions 1826, 1828 of condenser 502 through which air flows.

Referring now to FIG. 19, there is provided a flow diagram of an illustrative method 1900 for operating a system (e.g., system 100 of FIGS. 1 and/or 400 of FIG. 4). Method 1900 begins with 1902 and continues with 1904 where circuit card(s) (e.g., circuit cards 416 of FIG. 4) are received in an internal space (e.g., internal space 452 of FIG. 4) of a chassis (e.g., chassis 460 of FIG. 4). In 1906, thermal communication is provided between the circuit card(s) and sidewall(s) of the chassis (e.g., sidewall(s) 402, 406 of FIG. 4).

A coolant (e.g., coolant 436 of FIG. 4) is circulated in 1908 through a first closed-loop channel (e.g., channel 410 of FIG. 4) of an electronic cooling apparatus (e.g., electronic cooling apparatus 400 of FIG. 4). The first closed-loop channel is formed in the sidewalls (e.g., sidewalls 402, 406, 408 of FIG. 4) of the chassis and extends through an evaporator (e.g., evaporator 510 of FIG. 5) disposed in the chassis. In 1910, heat is allowed to be transferred from the circuit card(s) to the coolant via one or more sidewalls of the chassis (e.g., sidewalls 402, 406 of FIG. 4).

The heated coolant is caused to flow into a portion of the first closed-loop channel that extends through the evaporator, as shown by 1912. This portion of the first closed-loop channel may comprise a first layer of fins and a second layer of fins in a stacked arrangement. The first and second layers of fins may be separated from each other by a third layer of fins which are contained in a second closed-loop channel.

A manifold (e.g., manifold 910 of FIG. 9) is used in 1912 to provide a uniform velocity distribution of the coolant in the evaporator. The manifold comprises a cavity (e.g., cavity 1302 of FIG. 13) having a trapezoidal shape and a baffle (e.g., baffle 1314 of FIG. 13) disposed in the cavity. The baffle comprises a plurality of spaced apart panels (e.g., panels 1316 of FIG. 13). The spacing between adjacent ones of the spaced apart panels increases from a center (e.g., center 1604 of FIG. 16) of the baffle in opposing directions (e.g., directions 1606, 1608 of FIG. 16) towards each end of the baffle (e.g., ends 1610, 1612 of FIG. 16).

In 1916, heat is allowed to be transferred from the coolant to a refrigerant flowing through a second closed-loop channel (e.g., closed-loop channel 550 of FIG. 5) of the electronic cooling apparatus. The second closed-loop channel is at least partially defined by the evaporator and is entirely contained in the chassis. The operations of an expansion value are controlled in 1918 to adjust an amount of refrigerant flow to the evaporator. This control can be based on, for example, a predicted heat load of the evaporator output from a machine learning algorithm. Subsequently, 1920 is performed where method 1900 ends or other operations are performed (e.g., return to 1904 or 1908).

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. An electronic cooling apparatus, comprising:
a chassis having an internal space that is sized and shaped to receive and structurally support at least one circuit card, the internal space being defined by a plurality of sidewalls with a channel formed therein in which a coolant is disposed, the coolant being in thermal communication with the at least one circuit card via at least one of the sidewalls when the at least one circuit card is disposed in the chassis;
a refrigerant-based cooling system disposed in the chassis and comprising an evaporator having an inlet port and an outlet port coupled to the channel of the chassis to define a first closed-loop channel for the coolant within the chassis, the evaporator being configured to
(i) facilitate a transfer of heat from the coolant to a refrigerant flowing through a second closed-loop channel of the chassis at least partially defined by the evaporator,
(ii) cause a non-linear flow of coolant from the inlet port to the outlet port,
(iii) have a non-uniform velocity distribution of the coolant through channels between the inlet port and outlet port; and
a pump disposed in the chassis and configured to cause the coolant to flow through the first closed-loop channel.

2. The electronic cooling apparatus according to claim 1, wherein both the first closed-loop channel and the second closed-loop channel reside entirely within the chassis.

3. The electronic cooling apparatus according to claim 1, wherein the chassis further comprises rails coupled to respective ones of the sidewalls and configured to directly contact the least one circuit card when the at least one circuit card is disposed in the chassis.

4. The electronic cooling apparatus according to claim 1, wherein the evaporator comprises a plurality of layers of fins that have a stacked arrangement and are separated from each other by parting sheets.

5. The electronic cooling apparatus according to claim 4, wherein at least first and second ones of the plurality of layers of fins are disposed in the first closed-loop channel, and a third one of the plurality of layers of fins is disposed in the second closed-loop channel.

6. The electronic cooling apparatus according to claim 5, wherein the third one of the plurality of layers of fins resides between the first and second ones of the plurality of layers of fins.

7. The electronic cooling apparatus according to claim 1, wherein the evaporator comprises a manifold at the inlet port and the outlet port.

8. The electronic cooling apparatus according to claim 7, wherein the manifold comprises a cavity having a trapezoidal shape that is defined by a plurality of sidewalls of the manifold.

9. The electronic cooling apparatus according to claim 8, wherein the manifold further comprises a baffle disposed in the cavity.

10. The electronic cooling apparatus according to claim 9, wherein the baffle comprises a plurality of spaced apart panels with variable spacing.

11. The electronic cooling apparatus according to claim 10, wherein the spacing between adjacent ones of the spaced apart panels increases from a center of the baffle in opposing directions towards each end of the baffle.

12. The electronic cooling apparatus according to claim 10, wherein a center panel of the baffle has at least one dimension smaller than that of another panel of the baffle.

13. The electronic cooling apparatus according to claim 1, wherein the refrigerant-based cooling system further comprises an expansion valve coupled to the evaporator, operations of the expansion valve controllable based on a predicted heat load of the evaporator.

14. A method for operating an electronic cooling apparatus, comprising:
receiving at least one circuit card in an internal space of a chassis of the electronic cooling apparatus in a manner that provides thermal communication between the at least one circuit card and at least one of a plurality of sidewalls of the chassis;
circulating a coolant through a first closed-loop channel of the electronic cooling apparatus that is formed in the plurality of sidewalls of the chassis and extends through an evaporator disposed in the chassis;
allowing heat to be transferred from the at least one circuit card to the coolant via one or more of the plurality of sidewalls of the chassis;
causing the coolant which has been heated to flow into a portion of the first closed-loop channel that extends through the evaporator disposed in the chassis; and
allowing heat to be transferred from the coolant to a refrigerant flowing through a second closed-loop channel of the electronic cooling apparatus, the second closed-loop channel being at least partially defined by the evaporator and being entirely contained in the chassis.

15. The method according to claim 14, further comprising using a manifold of the evaporator to provide a uniform velocity distribution of the coolant in the evaporator.

16. The method according to claim 15, wherein the manifold comprises a cavity having a trapezoidal shape and a baffle disposed in the cavity.

17. The method according to claim 16, wherein the baffle comprises a plurality of spaced apart panels, the spacing between adjacent ones of the spaced apart panels increases from a center of the baffle in opposing directions towards each end of the baffle.

18. The method according to claim 14, wherein the portion of the first closed-loop channel that extends through the evaporator comprises a first layer of fins and a second layer of fins in a stacked arrangement.

19. The method according to claim 18, wherein the first and second layers of fins are separated from each other by a third layer of fins which are contained in the second closed-loop channel.

20. The method according to claim 14, further comprising controlling operations of an expansion valve to adjust an amount of refrigerant flow from the expansion valve to the evaporator, based on a predicted heat load of the evaporator.

* * * * *